(12) United States Patent
Bennett et al.

(10) Patent No.: US 6,783,836 B2
(45) Date of Patent: Aug. 31, 2004

(54) PRETREATED SHEET PRODUCT FOR LITHOGRAPHIC PLATES

(75) Inventors: David Bennett, Davenport, IA (US); Sallie L. Blake, Long Grove, IA (US); Robert E. Bombalski, New Kensington, PA (US); Joseph D. Guthrie, Murrysville, PA (US); Daniel L. Serafin, Wexford, PA (US)

(73) Assignee: Alcoa Inc., Pittsburgh, PA (US)

( * ) Notice: Subject to any disclaimer, the term of this patent is extended or adjusted under 35 U.S.C. 154(b) by 0 days.

(21) Appl. No.: 09/942,353

(22) Filed: Aug. 29, 2001

(65) Prior Publication Data

US 2002/0150750 A1 Oct. 17, 2002

Related U.S. Application Data

(60) Provisional application No. 60/228,982, filed on Aug. 30, 2000, and provisional application No. 60/286,145, filed on Apr. 24, 2001.

(51) Int. Cl.[7] ............................. G03C 1/77; B41N 1/08
(52) U.S. Cl. .................. 428/149; 428/141; 428/143; 428/331; 101/454; 101/455; 101/473; 101/453; 430/272.1; 430/278.1
(58) Field of Search ............................. 428/141, 143, 428/149, 331; 101/454, 455, 473, 453; 430/272.1, 278.1

(56) References Cited

U.S. PATENT DOCUMENTS

| | | | | |
|---|---|---|---|---|
| 3,220,832 A | * | 11/1965 | Uhlig | 430/60 |
| 3,276,868 A | | 10/1966 | Uhlig et al. | |
| 3,438,778 A | | 4/1969 | Uhlig et al. | 96/33 |
| 3,922,441 A | * | 11/1975 | Shaw | 428/446 |
| 4,272,604 A | * | 6/1981 | Meador et al. | 430/159 |
| 5,368,974 A | * | 11/1994 | Walls et al. | 430/156 |
| 5,711,991 A | | 1/1998 | Robinson et al. | |
| 5,759,742 A | * | 6/1998 | West et al. | 430/278.1 |
| 5,795,647 A | | 8/1998 | Robinson et al. | |
| 5,829,353 A | | 11/1998 | Ellis | |
| 6,014,929 A | | 1/2000 | Teng | 101/456 |
| 6,165,689 A | * | 12/2000 | Vermeersch et al. | 430/302 |
| 6,182,571 B1 | * | 2/2001 | Jolliffe et al. | 101/465 |
| 6,283,029 B1 | * | 9/2001 | Tashiro et al. | 101/455 |
| 2002/0150750 A1 | * | 10/2002 | Bennett et al. | 428/327 |

FOREIGN PATENT DOCUMENTS

| | | | |
|---|---|---|---|
| EP | 0626273 | 5/1994 | |
| EP | 0 908 307 A2 | 4/1999 | ............ B41C/1/10 |
| EP | 0 908 784 | 4/1999 | ............ G03F/7/11 |
| EP | 0 908 307 A3 | 12/1999 | ............ B41C/1/10 |
| WO | WO 97/31783 | * 9/1997 | |

\* cited by examiner

*Primary Examiner*—William P. Watkins, III
(74) *Attorney, Agent, or Firm*—Glenn E. Klepac; Norman F. Hainer, Jr.

(57) ABSTRACT

A lithographic sheet product having a substrate with a roll textured surface covered by a pretreatment layer. The pretreatment layer enhances adhesion of a printing composition to the sheet product and is composed of a polymer selected from the group consisting of polymers of acrylic acid, polymers of methacrylic acid, an organophosphorous polymer and copolymers of an organophosphorous compound and acrylic acid or methacrylic acid. Dopant particles of alumina, silica, titanium dioxide or a black dye or pigment may be added to the pretreatment layer to reduce the gloss and reflectance of the pretreatment layer in a printing process. Etching of the substrate also reduces gloss and reflectance.

3 Claims, 1 Drawing Sheet

PRETREATED SHEET PRODUCT FOR LITHOGRAPHIC PLATES

RELATED APPLICATIONS

This application claims the benefit of U.S. application Ser. No. 60/228,982 filed Aug. 30, 2000 entitled "Pretreated Aluminum Sheet Product For Lithographic Plates" and U.S. application Ser. No. 60/286,145 filed Apr. 24, 2001 entitled "Pretreated Aluminum Sheet Product For Lithographic Plates".

FIELD OF THE INVENTION

The present invention is directed to a non-anodized sheet product having at least one treated surface for use in a lithographic plate.

BACKGROUND OF THE INVENTION

The present invention is directed to improving the surface of metals and their alloys, particularly aluminum and aluminum alloys, so that a variety of materials may be bonded, attached, adhered, mated, held, either permanently or temporarily, to the surface of the finished product which may be a foil, a sheet, a plate, a composite or laminate. Such finished products include flexographic plates and lithographic plates. These products typically require use of a rolled aluminum sheet.

Rolled metal alloy sheet and plate have an identifiable bias. The rolling activity creates roll grind, which appears as striations that ran lengthwise in the rolled product. These striations may interfere with certain downstream activities such as lithography. In lithography, for example, the sheet surface is coated with a photosensitive or laser-imagable coating. The run life and printed image definition are controlled by the bond strength of the aluminum to the coating and the directionality of the resultant product. The presence of roll grind in these products results in an end product with low run life and poor definition due to poor bond strength and directionality. To combat these effects typical lithographic plate manufacturers chemically or mechanically grain the surface of the aluminum to create more extended surface area to enhance the bond strength of the lithographic plate to a printing composition and reduce the directionality in the product.

Conventional treatment of aluminum substrates for adhesion of a printing composition, such as photosensitive coating, thereto includes graining and anodizing the surface of the substrate onto which the photosensitive coating is to be applied. Anodization typically produces alumina on the surface of the substrate. In addition, the aluminum surface may be post-treated to improve the adhesion of a photosensitive coating to the aluminum substrate while also creating an oleophobic surface. Graining and anodizing and/or post-treating (e.g. silicating) an aluminum substrate require specialized processing steps. Graining may be performed electrochemically or mechanically (e.g. brush graining). These processes add significantly to the time and expense of preparing an aluminum substrate for coating with a photosensitive material.

Accordingly a need remains for a sheet which minimizes or avoids graining and anodizing and/or post-treating processes and which readily retains coatings thereon for the manufacture of a lithographic sheet or plate.

SUMMARY OF THE INVENTION

This need is met by the lithographic sheet product of the present invention. The sheet product includes a substrate, preferably made from an aluminum alloy, having at least one surface that is covered with a polymeric pretreatment layer. The pretreatment layer is particularly suited for enhancing the adhesion of a printing composition to the substrate. The printing composition may be a photosensitive coating or ink or the like. Suitable polymers for the pretreatment layer include polymers of acrylic acid or methacrylic acid, organophosphorous polymers and copolymers thereof. The surface of the substrate may be mill-finished or more preferably, is roll textured.

The pretreatment layer may further include about 4 to about 50 wt. % dopant particles of alumina, silica, titanium dioxide, black dye or black pigment or the substrate may be etched or both. When the lithographic sheet product is covered with a photosensitive coating, the dopant particles and the etched surface increase surface area and minimize the gloss and reflectance of light from the pretreatment layer during exposure of the photosensitive coating to imaging light.

BRIEF DESCRIPTION OF THE DRAWING

A complete understanding of the invention will be obtained from the following description when taken in connection with the accompanying drawing figure.

DESCRIPTION OF THE INVENTION

Figure 1:
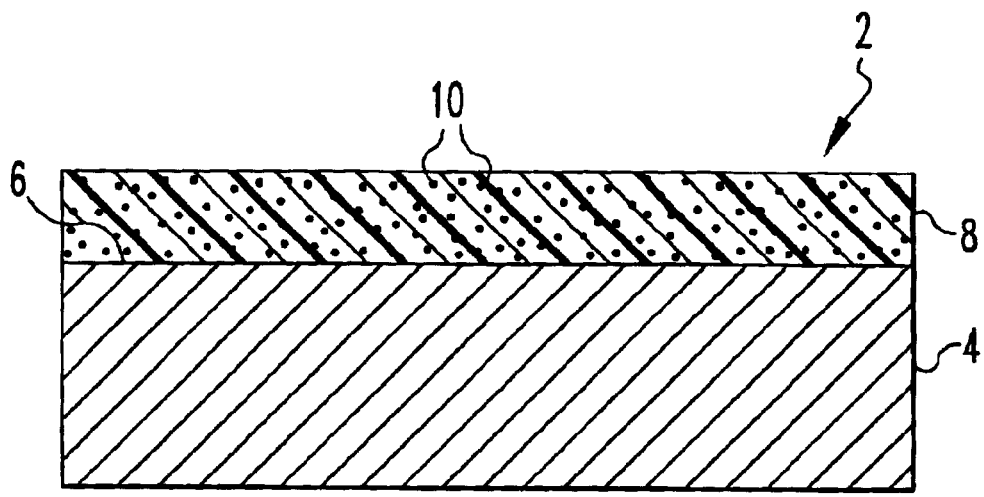
FIG. 1 is a cross-sectional view of the lithographic sheet product of the present invention.

Referring to FIG. 1, the lithographic sheet product 2 of the present invention is directed to a metal or polymeric substrate 4 having a surface 6 covered with a pretreatment layer 8. The surface 6 of a metal substrate 4 may be textured. By the phrase "pretreatment layer" it is meant a layer which may or may not be involved in the ultimate printing process and which provides for acceptable adhesion between the underlying metal component and printing compositions applied thereto. The metal substrate 4 is preferably non-anodized and non-grained thereby minimizing the cost of manufacturing the lithographic sheet product compared to conventional lithographic substrates. The substrate preferably is manufactured from an aluminum alloy, steel or a polymeric material. Some suitable aluminum alloys include alloys of the AA 1000, 3000, and 5000 series. Suitable steel substrates include mild steel sheet and stainless steel sheet. The polymeric material for the substrate may be a polyester film.

An aluminum alloy sheet should have a thickness of about 1–30 mils, preferably about 5–20 mils, and more preferably about 8–20 mils. A non-anodized aluminum alloy substrate having a thickness of about 8–9 mils is particularly preferred.

Substrate

The metal textured surface 6 of the substrate 4 may be produced by roll texturing, electrochemical graining, mechanical graining or other methods to uniformly increase the surface area of the metal. Roll texturing is preferred and may be accomplished with a roll having an outer surface roughened via electron discharge texturing (EDT), laser texturing, electron beam texturing, mechanical texturing, chemical texturing, electrochemical texturing or combinations thereof. Preferred mechanical texturing techniques include shot peening and brush graining. A preferred technique for roll texturing is EDT. In EDT, a plurality of arc generating electrodes is spaced from the outer surface of the roll and pulses of electron arcs are discharged against the roll outer surface. The arcs provide a generally uniform roll surface of peaks and valleys of desired dimensions. The electrodes rotate and traverse across the roll outer surface. The dimensions are controlled at least in part by the voltage level and the current level of the arcs, the length of the arc pulses, the length of time between arc pulses, and the electrode rotational speed and traverse rate. Electron discharge texturing is disclosed in U.S. Pat. Nos. 3,619,881 and 4,789,447, both being incorporated herein by reference. The roughness value (average distance of valley to peak of the roughened surface referred to as Ra) is an important parameter for the determination of the kind of texture that has been imposed on the roll. For example, in the production of lithographic plate, the desired average Ra value may be 6 microinches. In order to achieve that average value, the roll itself must have the appropriate depth of impingement vis a vis the plate otherwise that average will not be met. To adjust the depth of impingement the amperage applied to the roll during texturing is varied. The range of amperage applied is about 0.1 to 5 amps, preferably 1 to 4 amps, and most preferably 1 to 3 amps.

When textured rolls, for example rolls subjected to EDT, are used to roll the substrate, the surface area of the substrate is increased (extended) in a non-directional manner. The surface area of a nominally flat aluminum sheet (mill finished) which is roll textured according to the present invention is extended by about 0.5 to about 10 %. The surface roughness (Ra) of aluminum sheet rolled with EDT treated rolls is generally less than about 40 microinches, preferably less than about 25 microinches, more preferably about 5 to about 15 microinches, most preferably about 6 to about 9 microinches. When citing a range of roughness, the range includes all intermediate roughness levels such as 6, 7 or 8 microinches on up through and including the end of the range. Substrate texture may be evaluated using a Perthen® instrument model M4P. The resulting textured surface provides a more diffuse surface than a mill finished surface with concomitant higher uniformity in the surface. During imaging of a lithographic sheet, non-uniform surface defects have been associated with back reflections. The textured surface of the product of the present invention minimizes back reflections and improves the uniformity and efficiency of the imaging process for lithographic sheet incorporating the product of the present invention as the substrate.

The texture of the treated roll preferably has a substantially uniform topography which imparts a substantially uniform topography in the rolling and cross-rolling directions of the sheet such that in the sheet a ratio of the Ra in the rolling direction to the Ra in the cross-rolling direction is about 0.8 to 1.2, as described in U.S. patent application Ser. No. 09/208,944, filed Dec. 10, 1998, entitled "An Ultrafine Matte Finish Roll for Treatment for Sheet Products and Method of Production", assigned to the assignee of the present application, incorporated herein by reference.

The roll and/or the substrate may be subjected to a pretreatment and post treatment, either prior to texturing or thereafter. For either the pretreatment or post treatment, the roll or substrate is cleaned with a suitable cleaning means and is then roughened. Roughening may be achieved by mechanical roughening of the substrate and/or roll with a system of rotating brushes and an abrasive slurry applied at a force substantially normal to the substrate surface. In another embodiment, chemical roughening of the substrate and/or roll with a solution which includes a single or plurality of inorganic acids, or alkaline compounds, and/or organic acids, esters, or other active end groups, including but not limited to imides, amides, and inorganic electrolytes, moieties, mixed complexes, and some combination thereof. In a preferred method of treating the substrate or roll surface, electrochemical roughening of the substrate is effected with a solution comprised of inorganic acids, organic acids, esters, and/or other active end groups including but not limited to imides, amides, electrolytes, mixed complexes and combinations thereof. It is found especially advantageous in electrochemical roughening to apply a single or plurality of alternating currents or by applying a direct current thereby causing electrochemical roughening of the surface. Alternating current is preferred.

Typically, the roll is comprised of an iron derived alloy, usually steel and any one of the alloys thereof. Extending the surface of the treated roll increases the surface area of the roll to about 0.05 to 50%, preferably 1 to about 50%, most preferably 10 to about 50% when compared to an untreated roll. The increase in the surface area is substantially orthogonal to the length of the roll. An untreated roll typically has elongated troughs. By texturing the roll, submicron sized craters and/or indentations are created and the negative image thereof can subsequently be transferred at least in part to the surface of the substrate thereby increasing the overall surface area and the working surface area of the substrate. Treated rolls are generally initially plated and then textured. Roll plating is achieved by electrochemical, chemical, thermomechanical, or mechanical plating; plating by sputter deposit; vapor deposition; and combinations thereof. The plating may be in a single or plurality of layers. The preferred plating is electrochemical in one or more layers. Plating metals comprise nickel, chromium, cobalt, and tungsten or some combination thereof. It is preferred to use chromium. The plating layers range from 0.01 to about 20,000 microns, preferably about 0.01 to 100 microns (0.39 to 3,937 microinches), more preferably 0.1 to 50 microns (3.9 to 1,968 microinches), and most preferably 1 to 20 microns (39 to 787 microinches).

After the roll has been treated, the roll is placed in a roll set. Typically two rolls are placed in a roll set opposing one another. The roll set may have one treated roll and an opposing untreated roll, or optionally may have two treated rolls opposed to each other. A roll set may be a stand alone operation or may have a plurality of roll sets placed in series.

The treated rolls communicate with the metal and metal alloys through reduction and/or through simply texturing and surface modification. Reduction is an optional but highly useful operation. Reductions range from about 0.1 to about 10%, preferably from about 1 to about 4%.

It has been found that a single pass through a mill having the textured roll is capable of ridding the substrate of a substantial portion of roll grind. This pass also increases the surface area which improves the coating load strength and print definition. However, from time to time it is found that a single pass may affect a surface devoid of bias; the first pass itself may create nonuniformity evidenced by optical striping, rolling blemishes and discrete areas that lack texture. Therefore, in certain circumstances it is preferred to make at least two passes through the roll set to obtain the desired texture. More than two passes can be made, but this increases the cost of each plate.

Pretreatment layer

Following roll texturing of the metal substrate 4, the substrate 4 is treated with a pretreatment composition to form the pretreatment layer 8 on at least one side of the substrate 4. Alternatively, the pretreatment layer 8 may be directly applied to a mill finished metal substrate 6 or a polymeric substrate 6. The pretreatment layer 8 may include a polymeric composition such as an acrylic acid, methacrylic acid, an organophosphorous compound or copolymers thereof.

Particularly suitable polymeric compositions include organophosphoric acids, organophosphonic acids, organophosphinic acids, as well as various salts, esters, partial salts, and partial esters thereof as described in pending U.S. Patent Application filed Aug. 22, 2000, entitled "Printing Plate Material with Electrocoated Layer", assigned to the assignee of the present application, incorporated herein by reference. The organophosphorus compound may be copolymerized with acrylic acid or methacrylic acid. Copolymers of vinyl phosphonic acid are preferred, especially copolymers containing about 5–50 mole % vinyl phosphonic acid and about 50–95 mole % acrylic acid and having a molecular weight of about 20,000–100,000. Copolymers containing about 70 mole % acrylic acid groups and about 30% vinyl phosphonic acid groups are particularly preferred. The polymer may be applied in batch processing of sheet or in coil processing by conventional coating processes including roll coating, powder coating, spray coating, vacuum coating, immersion coating or anodic electrodeposition. Preferably, the polymer is applied by roll coating, typically to a thickness of about 0.01–1.0 mil, preferably about 0.05–0.3 mil. One or more layers of the polymer composition may be applied to the rolled substrate.

Alternatively, when the substrate 6 is metal, the polymer composition may include an electrocoated polymer such as described in the above-referenced application filed Aug. 22, 2000. The electrocoated polymer preferably includes a polymer of acrylic acid or methacrylic acid, or their analogs and esters, alone or in mixtures and copolymers with an epoxy resin.

It has been found that adhesion of the pretreatment composition to the textured substrate is enhanced over adhesion to a mill finished work piece. It is believed that the increased surface area of the textured substrate provides for additional surface area for physical adhesion of the pretreatment composition to the substrate and also provides additional sites for chemical interaction between the pretreatment composition and the substrate.

The product of the present invention is particularly suited as a substrate for lithographic plates. Layers of printing compositions may be applied to the textured and pretreated substrate and exhibit superior adhesion to the underlying metal sheet or plate. Such printing compositions include photosensitive coatings and laser-imagable coatings, such as Wipe On Coating, No. SO-1 or No. 4010P used with a developer No. CD-03 available from American Litho Inc. of Grand Rapids, Mich. Accordingly, the textured and pretreated substrate of the present invention is useful as a universal substrate for a variety of printing sheets and plates.

The present invention may be used as a printing plate for "ink jet" imaging or other discrete coating technologies. These processes entail applying a polymer in discrete locations on the treated aluminum substrate via ink jet technology or the like to create an image on the printing plate. In these processes, once the coating is applied and cured, the product is ready for printing on an appropriate press.

The lithographic sheet product of the present invention may also be used as a printing plate with photosensitive coatings and may be further treated as described below. Printing plates having photosensitive coatings typically are exposed to ultraviolet (UV) light through a mask. The UV light alters portions of the photosensitive coating exposed through openings in the mask, resulting in a difference in solubility of the photosensitive coating between exposed and unexposed areas. It is important that the photosensitive coating adheres tightly to the substrate and that the interaction of light with the photosensitive coating during exposure of a photosensitive coating is maximized. Hence, the pretreatment layer 8 should minimally impact the exposure of a photosensitive coating.

In one embodiment of the invention shown in FIG. 1, the polymeric pretreatment layer 8, particularly, a layer of a copolymer of vinyl phosphonic acid and acrylic acid, is doped with particles 10 of alumina, silica, titanium dioxide, or a black dye or pigment to increase surface area and/or minimize the gloss and reflectance of the pretreatment layer. The alumina particles may be about 1.0 to about 2.0 microns (39 to 79 microinches) in size. The silica particles may be about 0.02 to about 5 microns (0.87 to 198 microinches) in size. The titanium dioxide particles may be about 0.25 to about 0.5 microns (9.8 to 19.8 microinches) in size. A preferred concentration of the particles 10 in the polymer pretreatment layer 8 is about 4 to about 50 wt. %. This concentration range includes all intermediate concentrations such as 5, 6 or 7 wt. % on up through and including the end of the range.

An alternative treatment of the lithographic sheet product of the present invention for minimizing gloss and reflectance therefrom includes etching the surface of the substrate. When the substrate is aluminum, etching may be accomplished by dipping the aluminum substrate in an alkaline composition such as an aqueous solution of sodium hydroxide. The dipping process is preferably performed at an elevated temperature (e.g. about 500° C. to about 90° C.) for about 15 to about 120 seconds. Other mechanisms for applying the etching composition to the aluminum substrate may be used such as by brushing the composition onto the aluminum substrate. A preferred roughness level from etching is an Ra value of about 15 to 50 microinches, more preferably about 25 microinches. The roughness imposed by etching described in this embodiment differs from the roughness which may be roll textured into the substrate described above. For the purposes of this embodiment (treatment for use in photosensitive coated aluminum sheet products), etching is performed on as-rolled or roll-textured materials.

These techniques of the present invention (doping of the pretreatment layer and etching of the aluminum substrate) may be used alone or in combination with each other to increase the adhesion of photosensitive coatings and to enhance absorption of light via a photosensitive coating applied to the product of the present invention.

Figure 2:
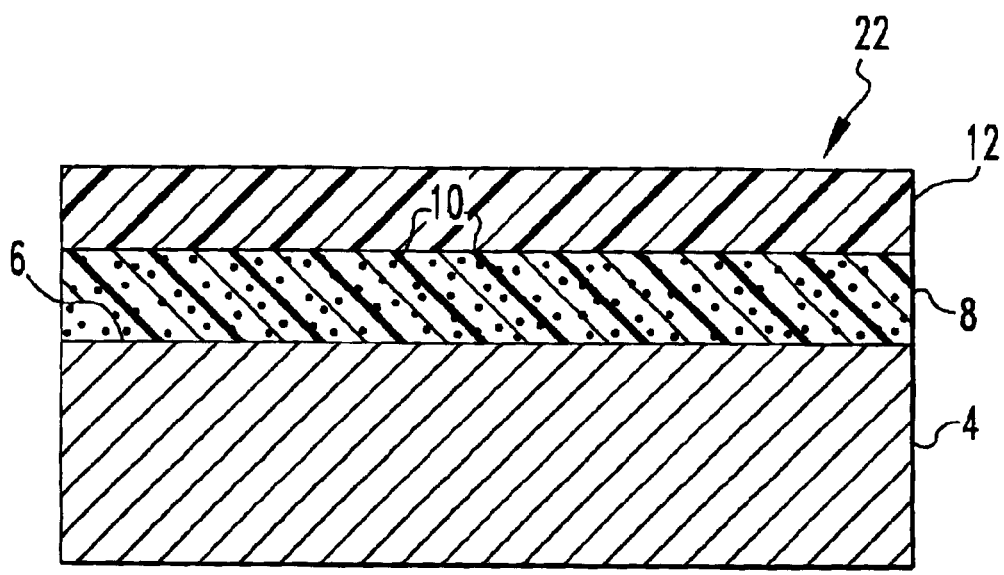
FIG. 2 is a cross-sectional view of another embodiment of the lithographic sheet product shown in FIG. 1.

Another embodiment of the invention shown in FIG. 2 includes another pretreatment layer 12 in the lithographic sheet product 22. The pretreatment layer 12 is shown as not containing any of the dopant particles 10. Although not specifically shown, the layer 12 may underlie the layer 8 and/or one or more of the layers 8 and 12 may be included in the lithographic sheet product of the present invention.

Although the invention has been described generally above, the following particular examples give additional illustration of the product and process steps typical of the present invention.

EXAMPLES 1–29

Roll textured aluminum substrates (average Ra of about 11–12 microinches) were coated with a 20 wt. % aqueous solution of a copolymer of vinyl phosphonic acid and acrylic acid diluted to 5 wt. % solids in ethanol (except as noted for Example 21) at coating weights of 1, 30 or 60 milligrams per square foot (msf). The surfaces of the substrates of Examples 3, 4, 7, 8, 11, 12, 15, 16, 19 and 20 were etched to an Ra value of 25 microinches ($\mu$in) by dipping the substrates in a 5 wt. % aqueous solution of sodium hydroxide at 180° F. for 75 seconds. The polymeric coating was undoped in Comparative Examples 1–4 and 21, doped with black dye in Examples 5–20, doped with $TiO_2$ in Examples 24 and 25, doped with alumina in Examples 22, 28, and 29, and doped with silica in Examples 23, 26, and 27 at the concentrations indicated in Table 1.

The samples produced in Examples 1–29 were tested for total reflectance and the results are reported in Table 1. The samples having a total reflectance of about 55 or less are particularly suitable for enhancing light absorption when coated with a photosensitive coating. The samples produced in Examples 22–29 were tested for gloss at 20°, 60°, and 85°, and the results are reported in Table 1.

EXAMPLES 30–31

Roll textured aluminum substrates having a roughness of about 9 microniches were coated with a 20 wt. % aqueous solution of a copolymer of vinyl phosphonic acid and acrylic acid diluted to 5 wt. % solids in ethanol and containing 50 wt. % silica particles (Syloid® 308, W. R. Grace & Company, Columbia, MD) about 4–5 micron in size in Example 30. The roughness (Ra) and peak count of the resulting sheet is reported in Table 2. Roughness and peak count measurements were made at two locations on a strip of the sheet at spaced apart locations (A and B) with the grain and across the grain. A conventional grained and anodized aluminum substrate was used as a control in Comparative Example 31 to demonstrate that the roughness and peak count of a sheet product of the present invention is similar to the roughness and peak count of conventional lithographic sheet product.

TABLE 2

| Example | Ra With the grain ($\mu$in) | Ra Across the grain ($\mu$in) | Peak Count With the grain | Peak Count Across the grain |
|---|---|---|---|---|
| 30 A | 15.5 | 17.0 | 693 | 685 |
|  | 17.5 | 17.5 | 718 | 609 |
|  | 16.5 | 16.5 | 650 | 650 |

TABLE 1

| Example | Additive Type | Additive Concentration (wt. %) | Polymer Coating Thickness | Surface Roughness | Total Reflectance | GLOSS 20° | GLOSS 60° | GLOSS 85° |
|---|---|---|---|---|---|---|---|---|
| Comparative 1 | None | — | 1 msf | As-rolled | 85.0 | | | |
| Comparative 2 | None | — | 30 msf | As-rolled | 80.0 | | | |
| Comparative 3 | None | — | 1 msf | Ra 25 $\mu$in | 80.5 | | | |
| Comparative 4 | None | — | 30 msf | Ra 25 $\mu$in | 68.0 | | | |
| 5 | Black dye[1] | 4.6 | 1 msf | As-rolled | 84.0 | | | |
| 6 | Black dye[1] | 4.6 | 30 msf | As-rolled | 59.0 | | | |
| 7 | Black dye[1] | 4.6 | 1 msf | Ra 25 $\mu$in | 79.3 | | | |
| 8 | Black dye[1] | 4.6 | 30 msf | Ra 25 $\mu$in | 49.6 | | | |
| 9 | Black dye[1] | 10 | 1 msf | As-rolled | 82.5 | | | |
| 10 | Black dye[1] | 10 | 30 msf | As-rolled | 45.1 | | | |
| 11 | Black dye[1] | 10 | 1 msf | Ra 25 $\mu$in | 77.4 | | | |
| 12 | Black dye | 10 | 30 msf | Ra 25 $\mu$in | 38.3 | | | |
| 13 | Black dye[2] | 4.6 | 1 msf | As-rolled | 84.6 | | | |
| 14 | Black dye[2] | 4.6 | 30 msf | As-rolled | 72.4 | | | |
| 15 | Black dye[2] | 4.6 | 1 msf | Ra 25 $\mu$in | 79.9 | | | |
| 16 | Black dye[2] | 4.6 | 30 msf | Ra 25 $\mu$in | 60.5 | | | |
| 17 | Black dye[2] | 10 | 1 msf | As-rolled | 84.2 | | | |
| 18 | Black dye[2] | 10 | 30 msf | As-rolled | 62.2 | | | |
| 19 | Black dye[2] | 10 | 1 msf | Ra 25 $\mu$in | 79.4 | | | |
| 20 | Black dye[2] | 10 | 30 msf | Ra 25 $\mu$in | 50.6 | | | |
| Comparative 21 | Solvent[3] | — | 30 msf | As-rolled | 80.2 | 5.5 | 34.4 | 49.3 |
| 22 | Alumina | 10 | 30 msf | As-rolled | 79.6 | 5.0 | 29.4 | 45.3 |
| 23 | $SiO_2$ | 10 | 30 msf | As-rolled | 80.7 | 5.4 | 25.2 | 43.7 |
| 24 | $TiO_2$ | 10 | 60 msf | As-rolled | 73.7 | 3.9 | 19.9 | 49.9 |
| 25 | $TiO_2$ | 20 | 60 msf | As-rolled | 72.2 | 3.3 | 14.4 | 44.4 |
| 26 | $SiO_2$ | 10 | 60 msf | As-rolled | 79.8 | 4.8 | 18.9 | 43.3 |
| 27 | $SiO_2$ | 20 | 60 msf | As-rolled | 79.2 | 3.2 | 13.2 | 38.4 |
| 28 | Alumina | 10 | 60 msf | As-rolled | 79.4 | 5.0 | 23.8 | 44.6 |
| 29 | Alumina | 20 | 60 msf | As-rolled | 78.9 | 4.2 | 17.0 | 37.2 |

[1]Nigrosine Base BA, Code 73704, Bayer Corporation (Pittsburgh, PA).
[2]Nigrosine WLF Uncut, Code 73704, Bayer Corporation (Pittsburgh, PA).
[3]Dilution solvent included about one third each of propylene glycol, diacetone alcohol and ethyl alcohol.

TABLE 2-continued

| Example | Ra With the grain (μin) | Ra Across the grain (μin) | Peak Count With the grain | Peak Count Across the grain |
|---|---|---|---|---|
| | 16.0 | 17.0 | 713 | 693 |
| | 18.5 | 17.0 | 617 | 655 |
| Average 30 B | 16.8 | 17.0 | 678 | 658 |
| | 14.0 | 14.5 | 622 | 749 |
| | 14.5 | 15.5 | 655 | 647 |
| | 14.5 | 14.5 | 647 | 662 |
| | 14.5 | 15.0 | 586 | 665 |
| | 15.5 | 14.5 | 604 | 650 |
| Average | 14.6 | 14.8 | 623 | 675 |
| Comparative 31 | 17.0 | 19.5 | 706 | NA |
| | 20.0 | 20.0 | 699 | NA |
| | 21.5 | 19.5 | 637 | NA |
| | 16.5 | 19.0 | 777 | NA |
| | 16.5 | 18.5 | 815 | NA |
| Average | 18.3 | 19.3 | 727 | NA |

It is expected that the process of preparing an aluminum sheet product treated according to the present invention will be four to ten times faster than the prior methods involving graining and anodizing. Moreover, the handling and disposal difficulties associated with the hazardous chemicals utilized in graining and anodizing are avoided.

It will be readily appreciated by those skilled in the art that modifications may be made to the invention without departing from the concepts disclosed in the foregoing description. Such modifications are to be considered as included within the following claims unless the claims, by their language, expressly state otherwise. Accordingly, the particular embodiments described in detail herein are illustrative only and are not limiting to the scope of the invention which is to be given the full breadth of the appended claims and any and all equivalents thereof.

We claim:

1. A lithographic sheet product consisting essentially of:

a non-anodized aluminum alloy substrate and at least one pretreatment layer positioned on a surface of said substrate, said layer comprising a polymer selected from the group consisting of polymers of acrylic acid, polymers of metacrylic acid, organophosphorous polymers, and copolymers of organophosphorous compounds and acrylic acid or metacrylic acid and about 4 to about 50 wt. % dopant particles consisting of silica having a particle size of 0.02–5 microns, wherein said pretreatment layer is adapted to adhere a printing composition to said sheet product.

2. The lithographic sheet product of claim 1 wherein said polymer comprises a copolymer of acrylic acid and vinyl phosphonic acid.

3. The lithographic sheet product of claim 1 wherein the concentration of said silica particles is about 20 to about 50 wt %.

* * * * *